United States Patent
Fukushima et al.

(10) Patent No.: US 12,557,214 B2
(45) Date of Patent: Feb. 17, 2026

(54) WIRING CIRCUIT BOARD

(71) Applicant: NITTO DENKO CORPORATION, Osaka (JP)

(72) Inventors: Kenta Fukushima, Osaka (JP); Hayato Takakura, Osaka (JP); Naoki Shibata, Osaka (JP); Ryosuke Sasaoka, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 216 days.

(21) Appl. No.: 18/471,033

(22) Filed: Sep. 20, 2023

(65) Prior Publication Data

US 2024/0107683 A1    Mar. 28, 2024

(30) Foreign Application Priority Data

Sep. 26, 2022 (JP) .................. 2022-152346

(51) Int. Cl.
*H05K 1/05* (2006.01)
*H05K 1/02* (2006.01)

(52) U.S. Cl.
CPC ............. *H05K 1/05* (2013.01); *H05K 1/0298* (2013.01); *H05K 1/056* (2013.01); *H05K 2201/09736* (2013.01)

(58) Field of Classification Search
CPC .... H05K 3/4007; H05K 1/0298; H05K 3/062; H05K 1/056; H05K 3/28; H05K 3/44; H05K 1/05; H05K 1/182; H05K 2201/09745; H05K 2201/0338; H05K 2201/09736; H05K 1/053
See application file for complete search history.

(56) References Cited

U.S. PATENT DOCUMENTS

| | | | | |
|---|---|---|---|---|
| 2010/0033875 A1* | 2/2010 | Yoshida | ............... | G11B 5/4833 360/244.1 |
| 2012/0318563 A1* | 12/2012 | Ookawa | ............... | H05K 1/0245 174/250 |
| 2013/0319748 A1* | 12/2013 | Ishii | .................... | H05K 1/0298 174/262 |

(Continued)

FOREIGN PATENT DOCUMENTS

| JP | 2018-207083 A | 12/2018 |
|---|---|---|
| JP | 2019-212656 A | 12/2019 |
| JP | 2022-147128 A | 10/2022 |

OTHER PUBLICATIONS

English Translation JP2019212656; Shibata et al.; Nitto Denko Corp; Published Dec. 12, 2019 (Year: 2019).*

*Primary Examiner* — Steven T Sawyer
(74) *Attorney, Agent, or Firm* — Edwards Neils LLC; Jean C. Edwards, Esq.

(57) ABSTRACT

A wiring circuit board includes a first insulating layer; a conductive pattern disposed on one side of the first insulating layer in a thickness direction; and a metal support layer disposed on the other side of the first insulating layer in the thickness direction. The metal support layer has a terminal support portion supporting three terminals of the conductive pattern, a wiring support portion supporting a wiring of the conductive pattern, and a second wiring support portion supporting a second wiring of the conductive pattern. A thickness of each of the wiring support portions is thinner than a thickness of the terminal support portion.

6 Claims, 15 Drawing Sheets

(56) References Cited

U.S. PATENT DOCUMENTS

| | | | |
|---|---|---|---|
| 2014/0262441 A1* | 9/2014 | Wu ..................... | H05K 1/0253 174/250 |
| 2014/0313619 A1* | 10/2014 | Sugimoto ............ | G11B 5/4846 156/60 |
| 2022/0053111 A1 | 2/2022 | Sommer et al. | |

* cited by examiner

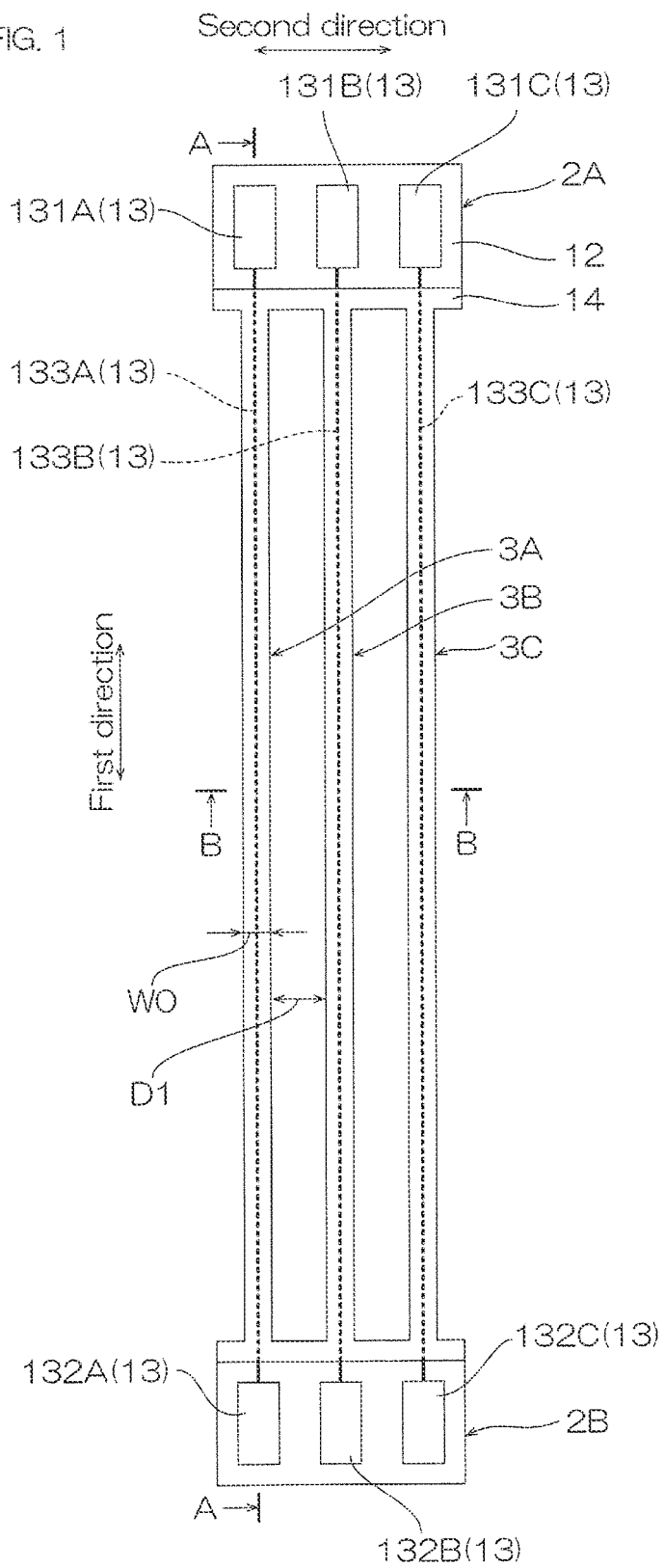

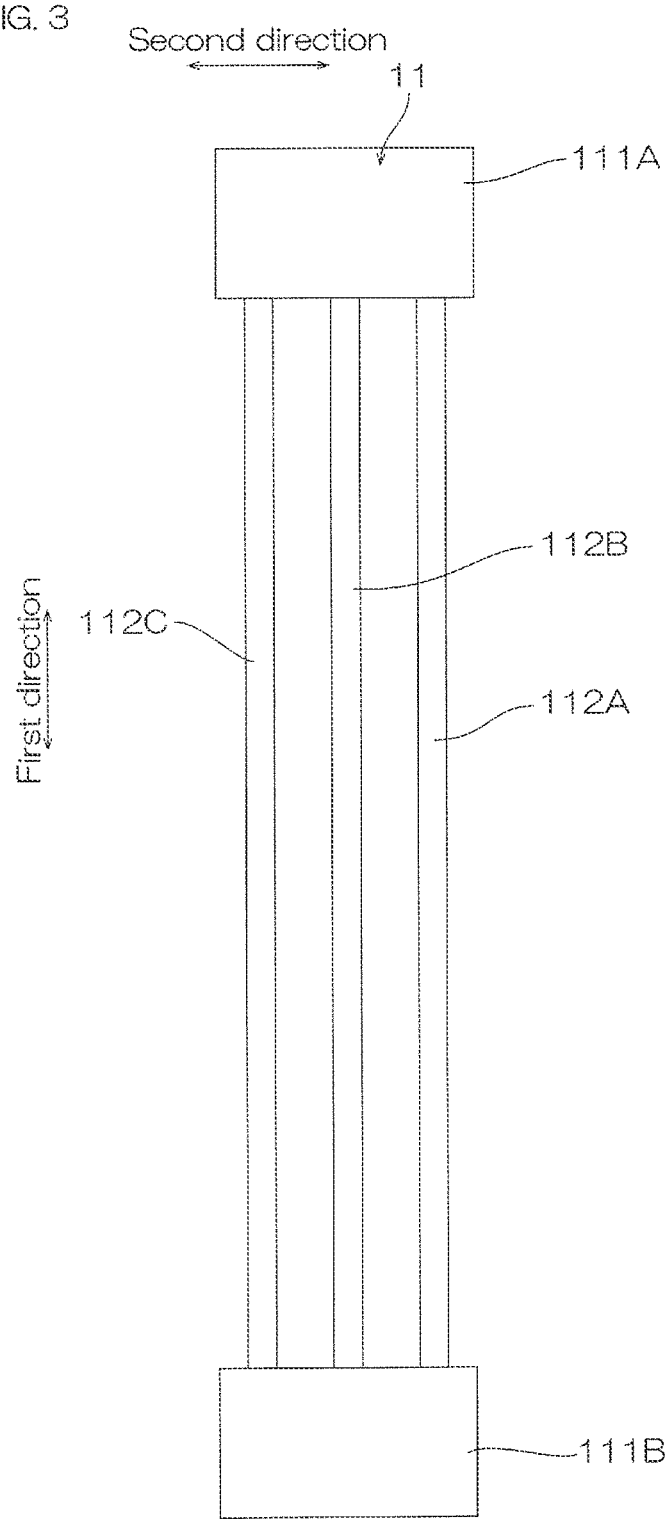

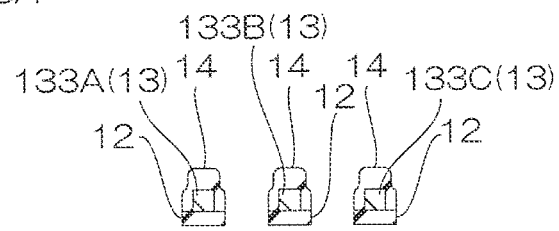
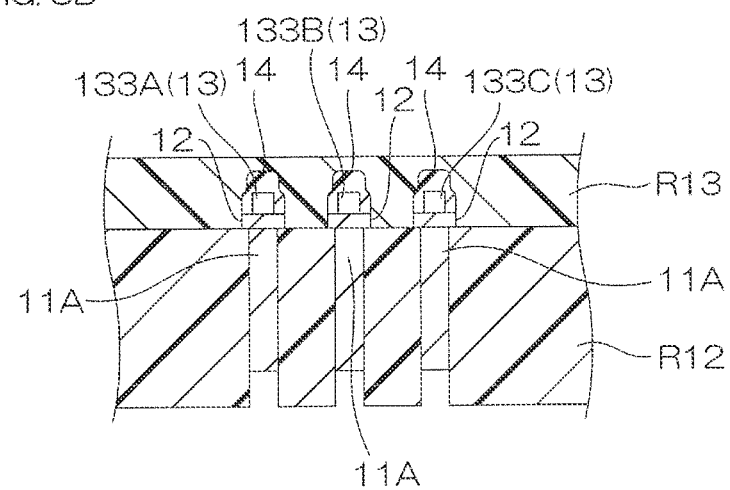

WIRING CIRCUIT BOARD

CROSS-REFERENCE TO RELATED APPLICATION

The present application claims priority from Japanese Patent Application No. 2022-152346 filed on Sep. 26, 2022, the contents of which are hereby incorporated by reference into this application.

TECHNICAL FIELD

The present invention relates to a wiring circuit board.

BACKGROUND ART

Conventionally, in a wiring circuit board including a metal-based support layer which functions as a heat sink, it has been proposed to improve heat dissipation by providing a first connecting body, a second connecting body disposed away from the first connecting body, and a plurality of wiring bodies disposed between the first connecting body and the second connecting body and disposed spaced from each other (ref: for example, Patent Document 1 below).

CITATION LIST

Patent Document

Patent Document 1: Japanese Unexamined Patent Publication No. 2019-212656

SUMMARY OF THE INVENTION

Problem to be Solved by the Invention

In the wiring circuit board described in the above-described Patent Document 1, when the wiring body moves between the first connecting body and the second connecting body, there is a possibility that the metal-based support layer of the wiring body may be brought into contact with its peripheral member.

The present invention provides a wiring circuit board which is capable of suppressing a contact of a wiring support portion with its peripheral member.

Means for Solving the Problem

The present invention [1] includes a wiring circuit board including an insulating layer; a conductive pattern disposed on one side of the insulating layer in a thickness direction and having a first terminal, a second terminal, a first wiring connected to the first terminal, and a second wiring connected to the second terminal and disposed spaced from the first wiring; and a metal support layer disposed on the other side of the insulating layer in the thickness direction and having a terminal support portion supporting the first terminal and the second terminal, a first wiring support portion supporting the first wiring, and a second wiring support portion supporting the second wiring and disposed spaced from the first wiring support portion, wherein a thickness of each of the first wiring support portion and the second wiring support portion is thinner than the thickness of the terminal support portion.

According to such a configuration, the thickness of each of the first wiring support portion and the second wiring support portion is thinner than the thickness of the terminal support portion.

Therefore, it is possible to suppress a contact of the wiring support portion with its peripheral member.

The present invention [2] includes the wiring circuit board of the above-described [1], wherein the metal support layer has a first metal support layer and a second metal support layer disposed between the first metal support layer and the insulating layer in the thickness direction, and a thickness of the second metal support layer of each of the first wiring support portion and the second wiring support portion is thinner than the thickness of the second metal support layer of the terminal support portion.

According to such a configuration, the thickness of the second metal support layer of each of the first wiring support portion and the second wiring support portion is made thinner than the thickness of the second metal support layer of the terminal support portion, so that the thickness of each of the first wiring support portion and the second wiring support portion is made thinner than the thickness of the terminal support portion, and it is possible to suppress the contact of the wiring support portion with its peripheral member.

The present invention [3] includes the wiring circuit board of the above-described [1], wherein the terminal support portion has a first metal support layer and a second metal support layer disposed between the first metal support layer and the insulating layer in the thickness direction, and each of the first wiring support portion and the second wiring support portion has the first metal support layer, and does not have the second metal support layer.

According to such a configuration, by not providing the second metal support layer in each of the first wiring support portion and the second wiring support portion, the thickness of each of the first wiring support portion and the second wiring support portion is made thinner than the thickness of the terminal support portion, and it is possible to suppress the contact of the wiring support portion with its peripheral member.

The present invention [4] includes the wiring circuit board of the above-described [1], wherein the terminal support portion has a first metal support layer, a second metal support layer disposed between the first metal support layer and the insulating layer in the thickness direction, and a third metal support layer disposed between the second metal support layer and the insulating layer in the thickness direction, wherein each of the first wiring support portion and the second wiring support portion has the first metal support layer and the third metal support layer, and does not have the second metal support layer.

According to such a configuration, by not providing the second metal support layer in each of the first wiring support portion and the second wiring support portion, the thickness of each of the first wiring support portion and the second wiring support portion is made thinner than the thickness of the terminal support portion, and it is possible to suppress the contact of the wiring support portion with its peripheral member.

Effect of the Invention

According to a wiring circuit board of the present invention, it is possible to suppress a contact of a wiring support portion with its peripheral member.

BRIEF DESCRIPTION OF THE DRAWINGS

FIG. 1 shows a plan view of a wiring circuit board as one embodiment of the present invention.

FIG. 3 shows a rear-side view of the wiring circuit board shown in FIG. 1.

FIG. 4A illustrating a preparation step,
 FIG. 4B illustrating a first pattern step,
 FIG. 4C illustrating a second pattern step, and
 FIG. 4D illustrating a third pattern step.

FIG. 5A illustrating a thinning step,
 FIG. 5B illustrating a bonding layer forming step,
 FIG. 5C illustrating a deposition step, and
 FIG. 5D illustrating an etching step.

FIGS. 8A and 8B show explanatory views for illustrating a method for producing the wiring circuit board shown in FIG. 7:
 FIG. 8A illustrating an etching step and
 FIG. 8B illustrating a deposition step.

FIG. 11A illustrating a preparation step,
 FIG. 11B illustrating a metal layer forming step,
 FIG. 11C illustrating a first pattern step,
 FIG. 11D illustrating a second pattern step, and
 FIG. 11E illustrating a third pattern step.

FIG. 12A illustrating a removing step,
 FIG. 12B illustrating a bonding layer forming step,
 FIG. 12C illustrating a deposition step, and
 FIG. 12D illustrating an etching step.

DESCRIPTION OF EMBODIMENTS

1. Wiring Circuit Board

Figure 2A:
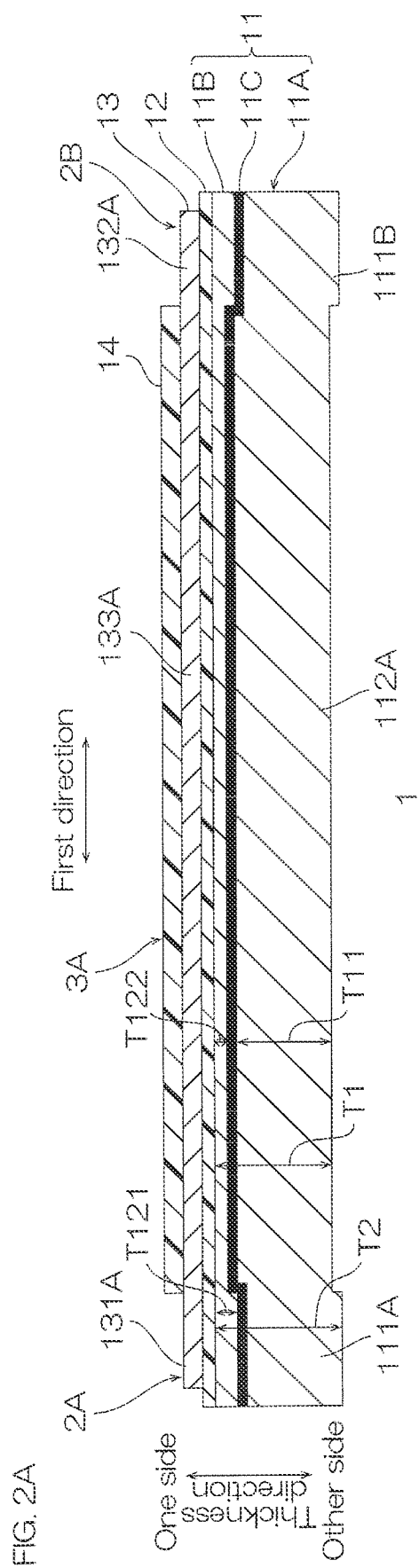
FIG. 2A shows an A-A cross-sectional view of the wiring circuit board shown in FIG. 1.

A wiring circuit board 1 is described with reference to FIGS. 1 to 3.

As shown in FIG. 1, the wiring circuit board 1 has two terminal arrangement portions 2A and 2B, and a plurality of connecting portions 3A, 3B, and 3C. The terminal arrangement portions 2A and 2B are disposed spaced from each other in a first direction. The first direction is perpendicular to a thickness direction of the wiring circuit board 1. Each of the terminal arrangement portions 2A and 2B extends in a second direction. The second direction is perpendicular to both the first direction and the thickness direction. In the terminal arrangement portion 2A, terminals 131A, 131B, and 131C of a conductive pattern 13 to be described later are disposed. In the terminal arrangement portion 2B, terminals 132A, 132B, and 132C of the conductive pattern 13 to be described later are disposed.

The connecting portions 3A, 3B, and 3C connect the terminal arrangement portion 2A to the terminal arrangement portion 2B. The connecting portions 3A, 3B, and 3C are disposed between the terminal arrangement portion 2A and the terminal arrangement portion 2B in the first direction. In the present embodiment, each of the connecting portions 3A, 3B, and 3C extends in the first direction. One end portion of each of the connecting portions 3A, 3B, and 3C in the first direction is connected to the terminal arrangement portion 2A. The other end portion of each of the connecting portions 3A, 3B, and 3C in the first direction is connected to the terminal arrangement portion 2B. A shape of each of the connecting portions 3A, 3B, and 3C is not limited. Each of the connecting portions 3A, 3B, and 3C may be a linear shape or a curved shape. The connecting portions 3A, 3B, and 3C are disposed spaced from each other in the second direction. In other words, the connecting portions 3A, 3B, and 3C are disposed spaced from each other in a direction perpendicular to a direction in which the connecting portion 3A extends. In the connecting portion 3A, a wiring 133A of the conductive pattern 13 to be described later is disposed. In the connecting portion 3B, a wiring 133B of the conductive pattern 13 to be described later is disposed. In the connecting portion 3C, a wiring 133C of the conductive pattern 13 to be described later is disposed.

A width W0 of each of the connecting portions 3A, 3B, and 3C is, for example, 300 µm or less, preferably 250 µm or less. The width W0 is, for example, 10 µm or more, preferably 50 µm or more.

The "width" refers to the maximum length in a direction perpendicular to both a direction in which the connecting portion extends and the thickness direction. For example, the "width" of the connecting portion 3A refers to the maximum length in a direction perpendicular to both a direction in which the connecting portion 3A extends and the thickness direction. In the present embodiment, the "width" refers to the maximum length in the second direction.

An interval D1 of each of the connecting portions 3A, 3B, and 3C is, for example, 300 µm or less, preferably 250 µm or less. The interval D1 is, for example, 5 µm or more, preferably 10 µm or more.

Figure 2B:
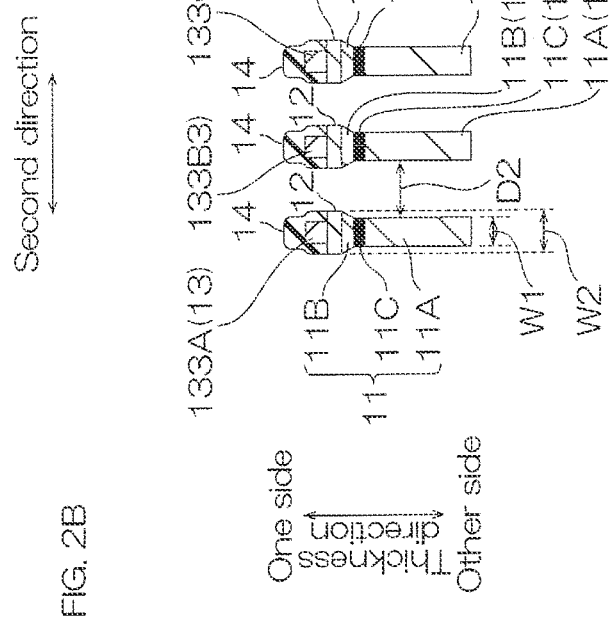
FIG. 2B shows a B-B cross-sectional view of the wiring circuit board shown in FIG. 1.

As shown in FIGS. 2A and 2B, the wiring circuit board 1 includes a metal support layer 11, a first insulating layer 12 as one example of the insulating layer, the conductive pattern 13, and a second insulating layer 14.

(1) Metal Support Layer

The metal support layer 11 supports the first insulating layer 12, the conductive pattern 13, and the second insulating layer 14. The metal support layer 11 is disposed on the other side of the first insulating layer 12 in the thickness direction.

As shown in FIG. 3, the metal support layer 11 has two terminal support portions 111A and 111B and a plurality of wiring support portions 112A, 112B, and 112C.

The terminal support portion 111A is the metal support layer 11 of the terminal arrangement portion 2A (ref: FIG. 1). The terminal support portion 111A supports at least the terminals 131A, 131B, and 131C of the conductive pattern 13. The terminal support portion 111A may support a portion of each of the wirings 133A, 133B, and 133C of the conductive pattern 13.

The terminal support portion 111B is the metal support layer 11 of the terminal arrangement portion 2B (ref: FIG. 1). The terminal support portion 111B is disposed spaced from the terminal support portion 111A in the first direction. The terminal support portion 111B supports at least the terminals 132A, 132B, and 132C of the conductive pattern 13. The terminal support portion 111B may support a portion of each of the wirings 133A, 133B, and 133C of the conductive pattern 13.

The wiring support portion 112A is the metal support layer 11 of the connecting portion 3A (ref: FIG. 1). The wiring support portion 112A connects the terminal support portion 111A to the terminal support portion 111B. The wiring support portion 112A is disposed between the terminal support portion 111A and the terminal support portion 111B in the first direction. The wiring support portion 112A extends in the first direction. One end portion of the wiring support portion 112A in the first direction is connected to the terminal support portion 111A. The other end portion of the wiring support portion 112A in the first direction is connected to the terminal support portion 111B. The wiring support portion 112A supports the wiring 133A (ref: FIG. 1).

The wiring support portion 112B is the metal support layer 11 of the connecting portion 3B (ref: FIG. 1). The wiring support portion 112B connects the terminal support portion 111A to the terminal support portion 111B. The wiring support portion 112B is disposed between the terminal support portion 111A and the terminal support portion 111B in the first direction. The wiring support portion 112B extends in the first direction. One end portion of the wiring support portion 112B in the first direction is connected to the terminal support portion 111A. The other end portion of the wiring support portion 112B in the first direction is connected to the terminal support portion 111B. The wiring support portion 112B supports the wiring 133B (ref: FIG. 1). The wiring support portion 112B is disposed spaced from the wiring support portion 112A in the second direction.

The wiring support portion 112C is the metal support layer 11 of the connecting portion 3C (ref: FIG. 1). The wiring support portion 112C connects the terminal support portion 111A to the terminal support portion 111B. The wiring support portion 112C is disposed between the terminal support portion 111A and the terminal support portion 111B in the first direction. The wiring support portion 112C extends in the first direction. One end portion of the wiring support portion 112C in the first direction is connected to the terminal support portion 111A. The other end portion of the wiring support portion 112C in the first direction is connected to the terminal support portion 111B. The wiring support portion 112C supports the wiring 133C (ref: FIG. 1). The wiring support portion 112C is disposed spaced from the wiring support portion 112B in the second direction.

As shown in the FIG. 2A, a thickness T1 of each of the wiring support portions 112A, 112B, and 112C is thinner than a thickness T2 of each of the terminal support portions 111A and 111B. The thickness T1 is, for example, 10 μm or more, preferably 50 μm or more, and for example, 250 μm or less, preferably 200 μm or less. The thickness T2 is, for example, 20 μm or more, preferably 50 μm or more, and for example, 300 μm or less, preferably 250 μm or less. Since the thickness T1 is thinner than the thickness T2, the wiring support portions 112A, 112B, and 112C are hardly brought into contact with its peripheral members as compared with the terminal support portions 111A and 111B. Therefore, it is possible to suppress a contact of the wiring support portions 112A, 112B, and 112C with its peripheral member.

As shown in FIGS. 2A and 2B, the metal support layer 11 consists of a plurality of metal layers. In the present embodiment, the metal support layer 11, as the plurality of metal layers, has a first metal support layer 11A, a second metal support layer 11B, and a bonding layer 11C.

(1-1) First Metal Support Layer

The first metal support layer 11A is disposed away from the first insulating layer 12 in the thickness direction. The first metal support layer 11A is made of a metal. Examples of a material for the first metal support layer 11A include copper, nickel, cobalt, iron, and alloys of these. Examples of the alloy include copper alloys. As the material for the first metal support layer 11A, preferably, a copper alloy is used.

In the terminal support portions 111A and 111B and the wiring support portions 112A, 112B, and 112C, a thickness T11 of the first metal support layer 11A is, for example, 10 μm or more, preferably 50 μm or more, and for example, 300 μm or less, preferably 250 μm or less. Preferably, the thickness of the first metal support layer 11A of the terminal support portions 111A and 111B is the same as the thickness of the first metal support layer 11A of the wiring support portions 112A, 112B, and 112C. The "same" means not only a case where there is no difference in dimensions, but also a case where there is a difference in dimensions within an allowable range of dimensional tolerance.

The first metal support layer 11A is preferably thicker than the second metal support layer 11B. Specifically, in the wiring support portions 112A, 112B, and 112C, the ratio (T11/T122) of the thickness T11 of the first metal support layer 11A to a thickness T122 of the second metal support layer 11B is, for example, 1.5 or more, preferably 2 or more, more preferably 4 or more, and for example, 20 or less, preferably 10 or less.

As shown in FIG. 2B, a width W1 of the first metal support layer 11A of each of the wiring support portions 112A, 112B, and 112C is, for example, 300 μm or less, preferably 250 μm or less. The width W1 of the first metal support layer 11A of each of the wiring support portions 112A, 112B, and 112C is preferably narrower than the width W0 (ref: FIG. 1) of each of the connecting portions 3A, 3B, and 3C. The width W1 of the first metal support layer 11A of each of the wiring support portions 112A, 112B, and 112C is, for example, 5 μm or more, preferably 10 μm or more.

In each of the wiring support portions 112A, 112B, and 112C, the ratio (T11/W1) of the thickness T11 of the first metal support layer 11A to the width W1 of the first metal support layer 11A is, for example, 1 or more, preferably, 5 or more. When the ratio (T11/W1) is the above-described lower limit value or more, it is possible to improve heat dissipation. The ratio (T11/W1) is, for example, 30 or less, preferably 10 or less. When the ratio (T11/W1) is the above-described upper limit value or less, it is possible to suppress a reduction in support strength.

An interval D2 of the first metal support layer 11A of each of the wiring support portions 112A, 112B, and 112C is, for example, 300 μm or less, preferably 250 μm or less. The interval D2 is, for example, 5 μm or more, preferably 10 μm or more. The interval D2 is preferably longer than the interval D1. Since the interval D2 is longer than the interval D1, it is possible to ensure the heat dissipation from space between the wiring support portion 112A and the wiring support portion 112B, and space between the wiring support portion 112B and the wiring support portion 112C.

(2) Second Metal Support Layer

As shown in FIG. 2A, the second metal support layer 11B is disposed on the other side of the first insulating layer 12 in the thickness direction. The second metal support layer 11B is disposed on the other surface of the first insulating layer 12 in the thickness direction. The second metal support layer 11B is disposed between the first metal support layer 11A and the first insulating layer 12 in the thickness direction. The second metal support layer 11B is made of the metal. Examples of the material for the second metal support layer 11B include copper, copper alloys, stainless steel, nickel, titanium, and 42-alloy. The material for the second metal support layer 11B may be the same as or different from the material for the first metal support layer 11A. As the material for the second metal support layer 11B, preferably, a copper alloy is used.

A thickness T121 of the second metal support layer 11B of each of the terminal support portions 111A and 111B is, for example, 5 μm or more, preferably 10 μm or more, and for example, 100 μm or less, preferably 50 μm or less.

The thickness T122 of the second metal support layer 11B of each of the wiring support portions 112A, 112B, and 112C is thinner than the thickness T121 of the second metal support layer 11B of each of the terminal support portions 111A and 111B. The thickness T122 of the second metal support layer 11B of each of the wiring support portions 112A, 112B, and 112C is, for example, 1 μm or more, preferably 5 μm or more, and for example, 50 μm or less, preferably 20 μm or less.

The ratio (T122/T121) of the thickness T122 to the thickness T121 is, for example, 0.1 or more, preferably 0.2 or more, and for example, 1 or less, preferably 0.5 or less.

As shown in FIG. 2B, a width W2 of the second metal support layer 11B of each of the wiring support portions 112A, 112B, and 112C is, for example, 300 μm or less, preferably 250 μm or less. The width W2 of the second metal support layer 11B of each of the wiring support portions 112A, 112B, and 112C is preferably the width W0 of each of the connecting portions 3A, 3B, and 3C or less.

The width W2 of the second metal support layer 11B of each of the wiring support portions 112A, 112B, and 112C is, for example, 10 μm or more, preferably 50 μm or more.

In each of the wiring support portions 112A, 112B, and 112C, the width W2 of the second metal support layer 11B is wider than the width W1 of the first metal support layer 11A.

(3) Bonding Layer

As shown in FIG. 2A, the bonding layer 11C is, if necessary, disposed between the first metal support layer 11A and the second metal support layer 11B in the thickness direction. The bonding layer 11C is disposed on the other surface of the second metal support layer 11B in the thickness direction. The bonding layer 11C is in contact with one surface of the first metal support layer 11A in the thickness direction. The bonding layer 11C ensures bondability of the first metal support layer 11A with respect to the second metal support layer 11B. The bonding layer 11C is made of the metal. Examples of the material for the bonding layer 11C include copper, chromium, nickel, and cobalt.

The thickness of the bonding layer 11C is, for example, 0.05 μm or more, preferably 0.1 μm or more, and for example, 50 μm or less, preferably 10 μm or less.

(4) Insulating Layer

The first insulating layer 12 is disposed on one side of the second metal support layer 11B in the thickness direction. The first insulating layer 12 is disposed on one surface of the second metal support layer 11B in the thickness direction. The first insulating layer 12 is disposed between the second metal support layer 11B and the conductive pattern 13. The first insulating layer 12 insulates the second metal support layer 11B from the conductive pattern 13. The first insulating layer 12 is made of a resin. Examples of the resin include polyimide, maleimide, epoxy resins, polybenzoxazole, and polyester.

(5) Conductive Pattern

The conductive pattern 13 is disposed on one side of the first insulating layer 12 in the thickness direction. The conductive pattern 13 is disposed on one surface of the first insulating layer 12 in the thickness direction. The conductive pattern 13 is disposed on the opposite side of the metal support layer 11 with respect to the first insulating layer 12 in the thickness direction. The conductive pattern 13 is made of the metal. Examples of the metal include copper, silver, gold, iron, aluminum, chromium, and alloys of these. From the viewpoint of obtaining excellent electrical properties, preferably, copper is used. A shape of the conductive pattern 13 is not limited.

As shown in FIG. 1, the conductive pattern 13 has the plurality of terminals 131A, 131B, and 131C, the plurality of terminals 132A, 132B, and 132C, and the plurality of wirings 133A, 133B, and 133C.

The terminals 131A, 131B, and 131C are disposed on the terminal arrangement portion 2A. Each of the terminals 131A, 131B, and 131C has a square land shape. The terminals 131A, 131B, and 131C are disposed spaced from each other in the second direction.

The terminals 132A, 132B, and 132C are disposed on the terminal arrangement portion 2B. Each of the terminals 132A, 132B, and 132C has a square land shape. The terminals 132A, 132B, and 132C are disposed spaced from each other in the second direction.

The wiring 133A electrically connects the terminal 131A to the terminal 132A. One end portion of the wiring 133A is connected to the terminal 131A. The other end portion of the wiring 133A is connected to the terminal 132A. At least a portion of the wiring 133A is disposed on the connecting portion 3A.

The wiring 133B electrically connects the terminal 131B to the terminal 132B. One end portion of the wiring 133B is connected to the terminal 131B. The other end portion of the wiring 133B is connected to the terminal 132B. At least a portion of the wiring 133B is disposed on the connecting portion 3B. The wiring 133B is disposed spaced from the wiring 133A in the second direction.

The wiring 133C electrically connects the terminal 131C to the terminal 132C. One end portion of the wiring 133C is connected to the terminal 131C. The other end portion of the wiring 133C is connected to the terminal 132C. At least a portion of the wiring 133C is disposed on the connecting portion 3C. The wiring 133C is disposed spaced from the wiring 133B in the second direction.

(6) Second Insulating Layer

As shown in FIG. 2B, the second insulating layer 14 covers all of the wirings 133A, 133B, and 133C. The second insulating layer 14 is disposed on the first insulating layer 12 in the thickness direction. As shown in FIGS. 1 and 2A, the second insulating layer 14 does not cover the terminals 131A, 131B, and 131C and the terminals 132A, 132B, and 132C. The second insulating layer 14 is made of the resin. Examples of the resin include polyimide, maleimide, epoxy resins, polybenzoxazole, and polyester.

2. Method for Producing Wiring Circuit Board

Next, a method for producing the wiring circuit board 1 is described with reference to FIGS. 4A to 6.

Figure 4A:
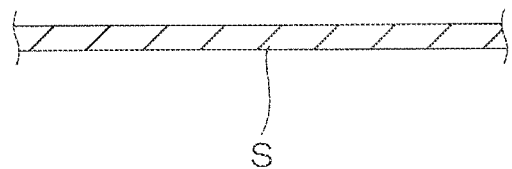
FIGS. 4A to 4D show process views for illustrating a method for producing a wiring circuit board.
Figure 4B:
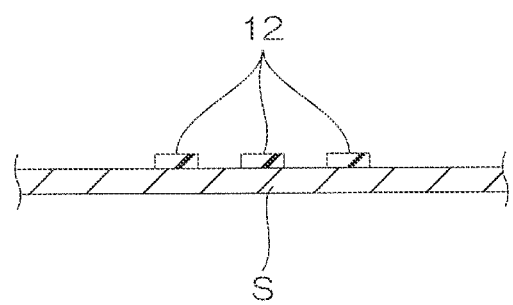
Figure 4C:
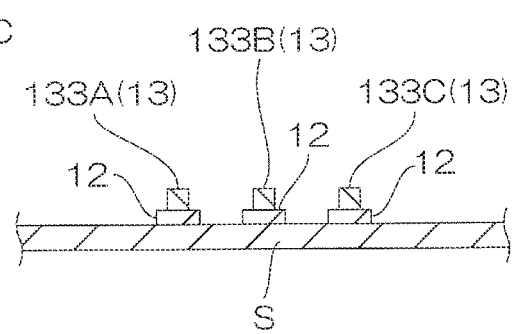
Figure 4D:
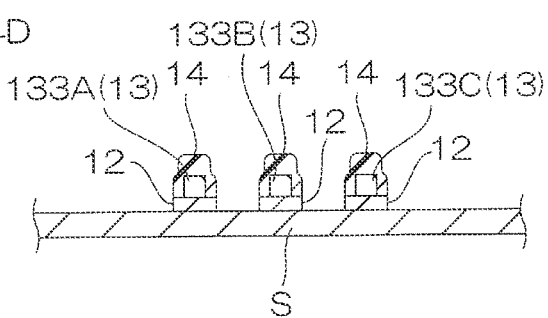
Figure 5A:
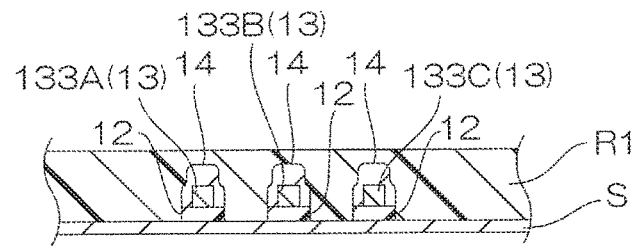
FIGS. 5A to 5C show process views for illustrating the method for producing a wiring circuit board subsequent to FIG. 4D.
Figure 5B:
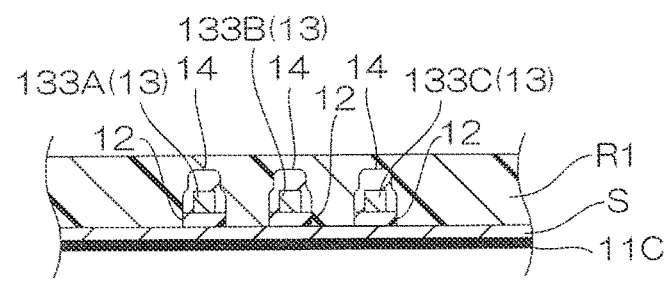
Figure 5C:
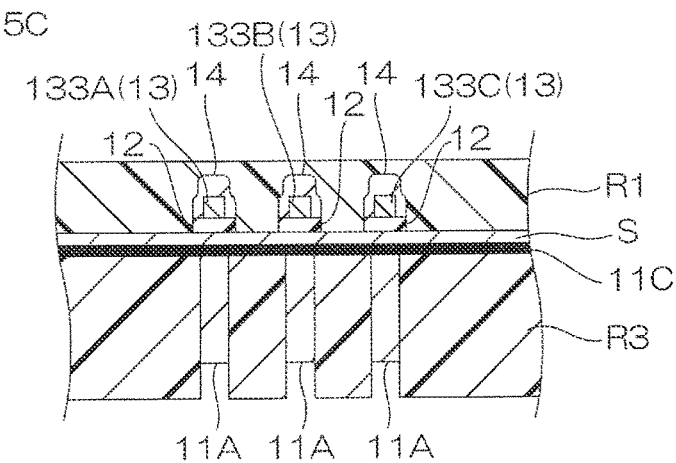
Figure 5D:
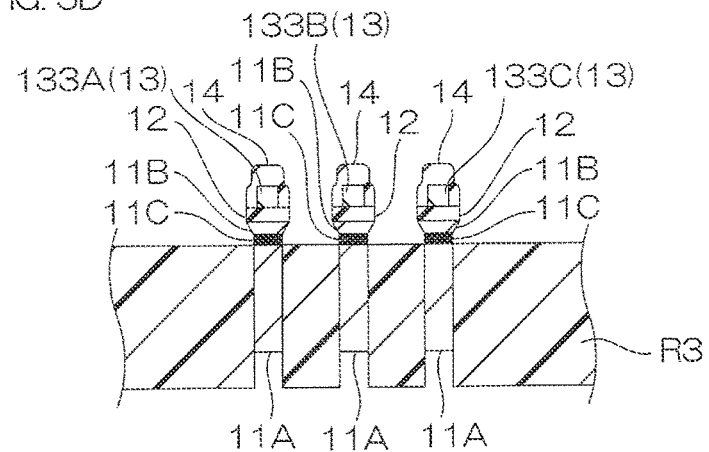

The method for producing the wiring circuit board 1 includes a preparation step (ref: FIG. 4A), a first patterning step (ref: FIG. 4B), a second patterning step (ref: FIG. 4C), a third patterning step (ref: FIG. 4D), a thinning step (ref: FIG. 5A), a bonding layer forming step (ref: FIG. 5B), a deposition step (ref: FIG. 5C), and an etching step (ref: FIG. 5D). The bonding layer forming step is, if necessary, carried out.

(1) Preparation Step

As shown in FIG. 4A, in the preparation step, a substrate S is prepared. In the present embodiment, the substrate S is a metal foil drawn from a roll of the metal foil. The material for the substrate S is the same as that of the second metal support layer 11B (ref: FIG. 2B).

(2) First Patterning Step

As shown in 4B, in the first patterning step, the first insulating layer 12 is formed on one side of the substrate S in the thickness direction. In the first patterning step, the first insulating layer 12 is formed on one surface of the substrate S in the thickness direction.

In order to form the first insulating layer 12, first, a solution (varnish) of a photosensitive resin is coated onto the substrate S and dried to form a coating film of the photosensitive resin. Next, the coating film of the photosensitive resin is exposed to light and developed. Thus, the first insulating layer 12 is formed into a predetermined pattern on the substrate S.

(3) Second Patterning Step

As shown in FIG. 4C, in the second patterning step, the conductive pattern 13 is formed on one side of the first insulating layer 12 in the thickness direction by electrolytic plating.

Specifically, first, a seed layer is formed on the surfaces of the first insulating layer 12 and the substrate S. The seed layer is, for example, formed by sputtering. Examples of the material for the seed layer include chromium, copper, nickel, titanium, and alloys of these.

Next, a plating resist is attached onto the first insulating layer 12 and the substrate S on which the seed layer is formed, and the plating resist is exposed to light in a state of shielding a portion where the conductive pattern 13 is formed.

Next, the exposed plating resist is developed. Then, the plating resist of the shielded portion is removed, and the seed layer is exposed in a portion where the conductive pattern 13 is formed. The plating resist of the exposed portion, that is, the portion where the conductive pattern 13 is not formed remains.

Next, the conductive pattern 13 is formed on the exposed seed layer by the electrolytic plating.

After the electrolytic plating is completed, the plating resist is peeled. Thereafter, the seed layer exposed by the peeling is removed by etching.

(4) Third Patterning Step

Next, as shown in FIG. 4D, in the third patterning step, the second insulating layer 14 is formed on the first insulating layer 12 and the conductive pattern 13 in the same manner as in the first insulating layer 12.

Thus, a circuit pattern is formed on one surface of the substrate S in the thickness direction. After the third patterning step and before the bonding layer forming step, a terminal protecting resist which is not shown for protecting the terminals 131A, 131B, and 131C and the terminals 132A, 132B, and 132C is formed. The terminal protecting resist is formed in a portion where the terminal arrangement portions 2A and 2B are formed, and is not peeled until the etching step (ref: FIG. 5D) is completed.

(5) Thinning Step

Next, as shown in FIG. 5A, in the thinning step, the thickness of the substrate S is reduced before the deposition step. When the bonding layer forming step is carried out before the deposition step, the thinning step is carried out before the bonding layer forming step.

Figure 6:
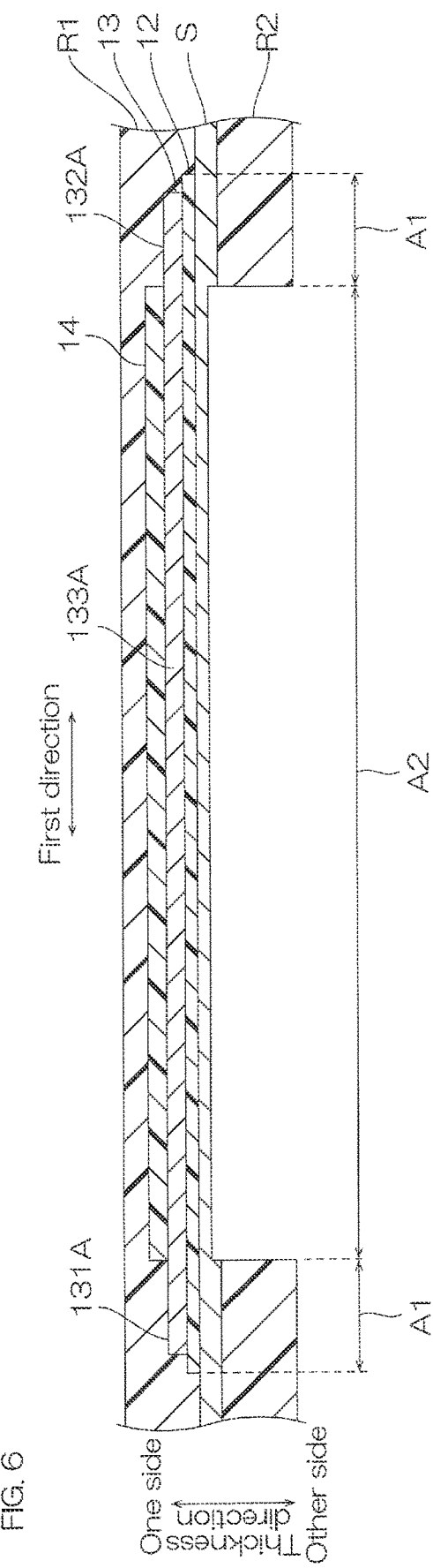
FIG. 6 shows an explanatory view for illustrating arrangement of an etching resist in the thinning step shown in FIG. 5A.

In the thinning step, as shown in FIG. 6, of the substrate S, the thickness of a second region A2 where the wiring support portions 112A, 112B, and 112C are formed is reduced without reducing the thickness of a first region A1 where the terminal support portions 111A and 111B are formed. In other words, the substrate S has the first region A1 where the terminal support portions 111A and 111B are formed, and the second region A2 where the wiring support portions 112A, 112B, and 112C are formed, and in the thinning step, the thickness of the second region A2 is reduced without reducing the thickness of the first region A1.

Specifically, in the thinning step, first, a plating resist R1 is formed on one surface of the substrate S in the thickness direction so as to cover the entire circuit pattern, and an etching resist R2 is formed on the other surface of the substrate S in the thickness direction so as to cover the first region A1 and to expose the second region A2. Next, the second region A2 of the substrate S is wet-etched from the other side of the substrate S in the thickness direction. Thus, the thickness of the second region A2 of the substrate S is reduced.

Thereafter, the etching resist R2 is peeled without peeling the plating resist R1.

(6) Bonding Layer Forming Step

Next, as shown in FIG. 5B, in the bonding layer forming step, before the deposition step, the bonding layer 11C is formed on the other surface of the substrate S in the thickness direction.

The bonding layer 11C is, for example, formed by the electrolytic plating or sputtering. When the bonding layer 11C is formed by the electrolytic plating, the bonding layer 11C is formed on the entire other surface of the substrate S in the thickness direction by the electrolytic plating without peeling the plating resist R1. When the bonding layer 11C is formed by the sputtering, the bonding layer 11C is formed on the entire other surface of the substrate S in the thickness direction by the sputtering using a target made of the above-described material for the bonding layer 11C.

(7) Deposition Step

Next, as shown in FIG. 5C, in the deposition step, after the second patterning step, a metal is deposited on the other side of the substrate S in the thickness direction to form the first metal support layer 11A. Specifically, the first metal support layer 11A is formed on the bonding layer 11C. In the deposition step, the metal is, for example, deposited by the electrolytic plating to form the first metal support layer 11A.

Specifically, first, the plating resist R3 is attached onto the bonding layer 11C without peeling the plating resist R1, and the plating resist R3 is exposed to light in a state of shielding a portion where the first metal support layer 11A is formed.

Next, the exposed plating resist R3 is developed. Then, the plating resist of the shielded portion is removed, and the bonding layer 11C is exposed in a portion where the first metal support layer 11A is formed. The plating resist R3 of the exposed portion, that is, the portion where the first metal support layer 11A is not formed remains.

Next, the metal is deposited on the exposed bonding layer 11C by the electrolytic plating. Thus, the first metal support layer 11A is formed on the bonding layer 11C.

(8) Etching Step

Next, as shown in FIG. 5D, in the etching step, after the deposition step, the substrate S is etched to form the second metal support layer 12.

Specifically, the plating resist R1 is peeled without peeling the plating resist R3, and the substrate S and the bonding layer 11C are wet-etched from one side of the substrate S in the thickness direction.

Then, the first insulating layer 12, the second insulating layer 14, and the terminal protecting resist function as an etching mask, and the substrate S and the bonding layer 11C of a portion where the first insulating layer 12, the second insulating layer 14, and the terminal protecting resist are not formed are removed.

Thus, the second metal support layer 11B is formed.

Thereafter, the plating resist R3 is peeled.

3. Function and Effect (1) According to the wiring circuit board 1, as shown in FIG. 2A, the thickness T2 of each of the wiring support portions 112A, 112B, and 112C is thinner than the thickness T1 of the terminal support portions 111A and 111B.

Therefore, it is possible to suppress the contact of the wiring support portions 112A, 112B, and 112C with its peripheral member.

For example, when the wiring circuit board 1 is mounted on an electronic device, there is a case where the terminal support portion 111B moves in a state where the terminal support portion 111A is fixed. At this time, there is a possibility that the wiring support portions 112A, 112B, and 112C move in accordance with the movement of the terminal support portion 111B to be brought into contact with its peripheral member.

However, in the wiring circuit board 1, since the thickness T2 of each of the wiring support portions 112A, 112B, and 112C is thinner than the thickness T1 of the terminal support portions 111A and 111B, it is possible to suppress the contact of the wiring support portions 112A, 112B, and 112C with its peripheral member.

(2) According to the wiring circuit board 1, the thickness T122 of the second metal support layer 11B of each of the wiring support portions 112A, 112B, and 112C is thinner than the thickness T121 of the second metal support layer 11B of the terminal support portions 111A and 111B.

Therefore, by making the thickness T122 of the second metal support layer 11B of each of the wiring support portions 112A, 112B, and 112C thinner than the thickness T121 of the second metal support layer 11B of the terminal support portions 111A and 111B, the thickness T2 of the wiring support portions 112A, 112B, and 112C is made thinner than the thickness T1 of the terminal support portions 111A and 111B to make it possible to suppress the contact of the wiring support portions 112A, 112B, and 112C with its peripheral member.

4. Modified Examples

Next, modified examples are described. In each modified example, the same reference numerals are provided for members corresponding to each of those in the above-described embodiment, and their detailed description is omitted.

Figure 7:
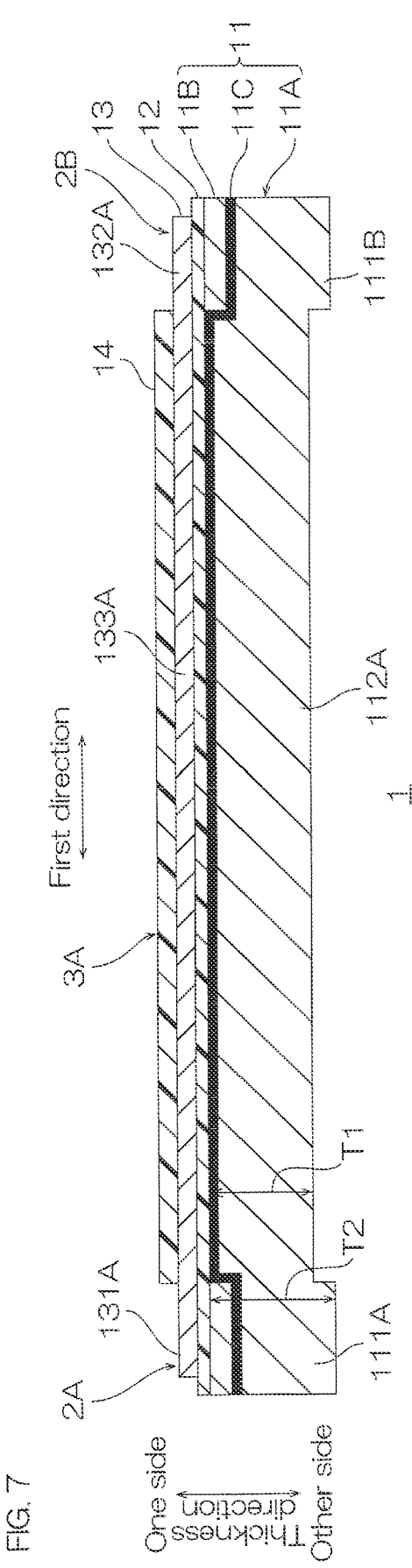
FIG. 7 shows a cross-sectional view of a wiring circuit board of a modified example (1), and the cross-sectional view corresponds to the A-A line shown in FIG. 1.

(1) As shown in FIG. 7, the terminal support portions 111A and 111B may have the first metal support layer 11A and the second metal support layer 11B; and each of the wiring support portions 112A, 112B, and 112C may have the first metal support layer 11A and may not have the second metal support layer 11B.

According to the wiring circuit board 1 of the modified example (1), by not providing the second metal support layer 11B in each of the wiring support portions 112A, 112B, and 112C, the thickness T2 of each of the wiring support portions 112A, 112B, and 112C is made thinner than the thickness T1 of the terminal support portions 111A and 111B to make it possible to suppress the contact of the wiring support portions 112A, 112B, and 112C with its peripheral member.

To produce the wiring circuit board 1 of the modified example (1), for example, the above-described thinning step (ref: FIGS. 5A and 6) is not carried out, and the etching step is carried out after the bonding layer forming step (FIG. 5B).

Specifically, the method for producing the wiring circuit board 1 of the modified example (1) includes a preparation step (ref: FIG. 4A), a first patterning step (ref: FIG. 4B), a second patterning step (ref: FIG. 4C), a third patterning step (ref: FIG. 4D), a bonding layer forming step (ref: FIG. 5B), an etching step (ref: FIG. 8A), and a deposition step (ref: FIG. 8B). The bonding layer forming step is, if necessary, carried out.

Figure 9:
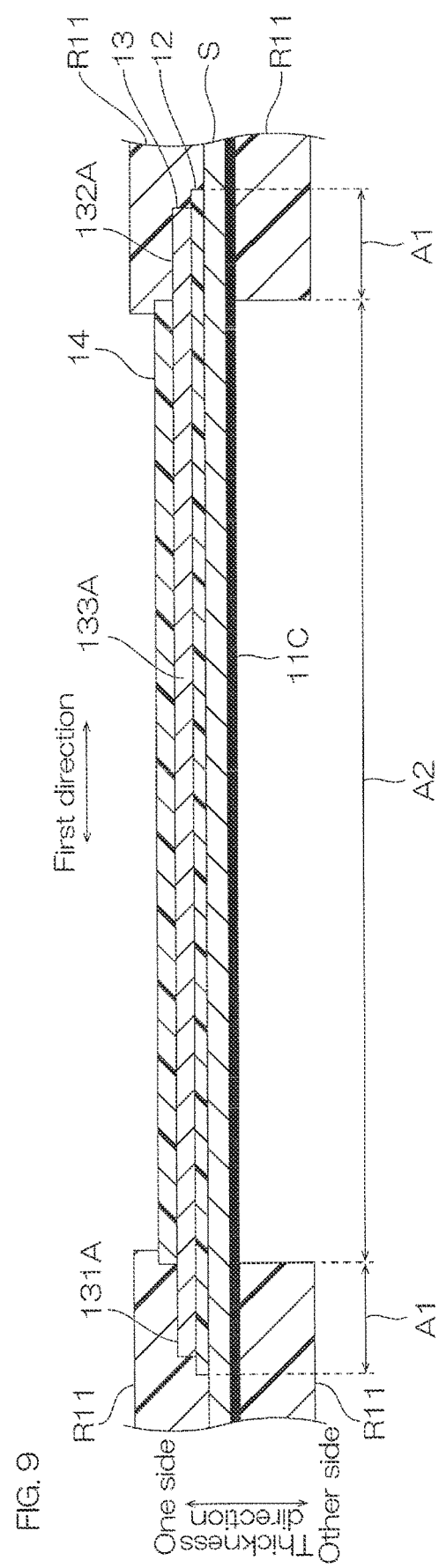
FIG. 9 shows an explanatory view for illustrating arrangement of an etching resist in the etching step shown in FIG. 8A.

In the etching step, first, as shown in FIG. 9, an etching resist R11 is formed on both surfaces of the substrate S. The etching resist R11 covers the first region A1 where the terminal support portions 111A and 111B are formed, and does not cover the second region A2 where the wiring support portions 112A, 112B, and 112C are formed of the substrate S.

Next, the second region A2 of the substrate S is wet-etched from both sides of the substrate S in the thickness direction.

Then, the first insulating layer 12, the second insulating layer 14, and, the etching resist R11 function as a mask, and the substrate S and the bonding layer 11C of the second region A2 are removed. In the etching step, as shown in FIG. 8A, the substrate S and the bonding layer 11C of the second region A2 are completely removed. Thus, the second metal support layer 11B is formed in the first region A1, and the second metal support layer 11B is not formed in the second region A2.

Next, as shown in FIG. 8B, the deposition step is carried out.

Specifically, first, a seed layer is formed on the other surface in the thickness direction of the exposed first insulating layer 12 by the etching step without peeling the etching resist R11 (ref: FIG. 9). The seed layer is, for example, formed by the sputtering. Examples of the material for the seed layer include chromium, copper, nickel, titanium, and alloys of these.

After the seed layer is formed, the etching resist R11 is peeled.

Next, a plating resist 12 is attached onto the first insulating layer 12 and the second metal support layer 11B so as to cover the seed layer and the bonding layer 11C, and the plating resist R12 is exposed to light in a state of shielding a portion where the first metal support layer 11A is formed.

Next, the exposed plating resist R12 is developed. Then, the plating resist R12 of the shielded portion is removed, and the seed layer or the bonding layer 11C is exposed in a portion where the first metal support layer 11A is formed. The plating resist R12 of the exposed portion, that is, the portion where the first metal support layer 11A is not formed remains.

A plating resist R13 is formed on one side of the plating resist 12 in the thickness direction so as to cover the entire circuit pattern.

Next, the metal is deposited on the exposed seed layer or bonding layer 11C by the electrolytic plating. Thus, the first metal support layer 11A is formed on the seed layer.

Thereafter, the plating resists R12 and R13 are peeled, and the seed layer which is covered with the plating resist R12 is removed by the etching.

Thus, the wiring circuit board of the modified example (1) is obtained.

Figure 10:
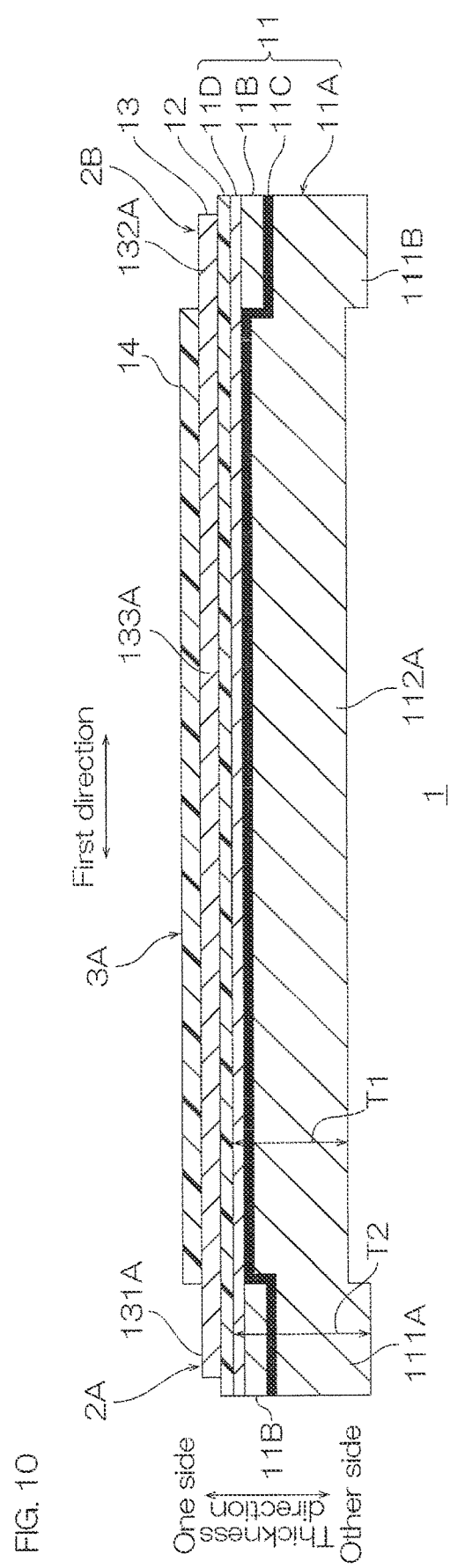
FIG. 10 shows a cross-sectional view of a wiring circuit board of a modified example (2), and the cross-sectional view corresponds to the A-A line shown in FIG. 1.

(2) As shown in FIG. 10, the terminal support portions 111A and 111B may have the first metal support layer 11A, the second metal support layer 11B, and a third metal support layer 11D which is disposed between the second metal support layer 11B and the insulating layer in the thickness direction; and each of the wiring support portions 112A, 112B, and 112C may have the first metal support layer 11A and the third metal support layer 11D and may not have the second metal support layer 11B.

In the wiring circuit board 1 of the modified example (2), in the same manner as in the wiring circuit board 1 of the modified example (1), by not providing the second metal support layer 11B in each of the wiring support portions 112A, 112B, and 112C, the thickness T1 of each of the wiring support portions 112A, 112B, and 112C is made thinner than the thickness T2 of the terminal support portions 111A and 111B to make it possible to suppress the contact of the wiring support portions 112A, 112B, and 112C with its peripheral member.

Figure 11A:
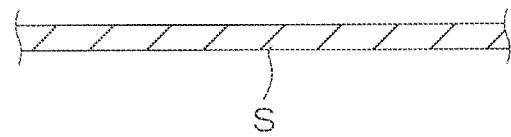
FIGS. 11A to 11E show process views for illustrating a method for producing the wiring circuit board shown in FIG. 10.
Figure 11B:
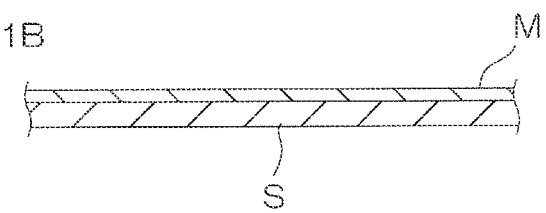
Figure 11C:
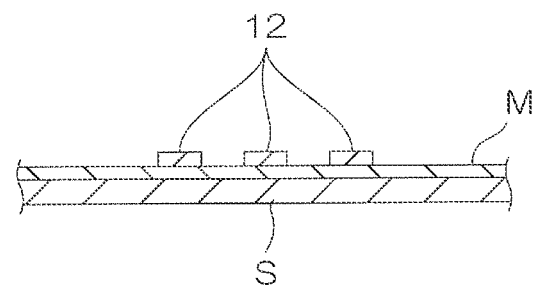
Figure 11D:
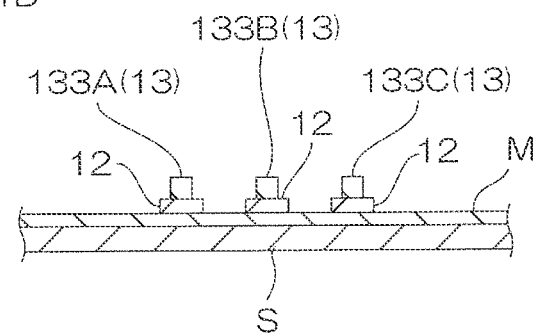
Figure 11E:
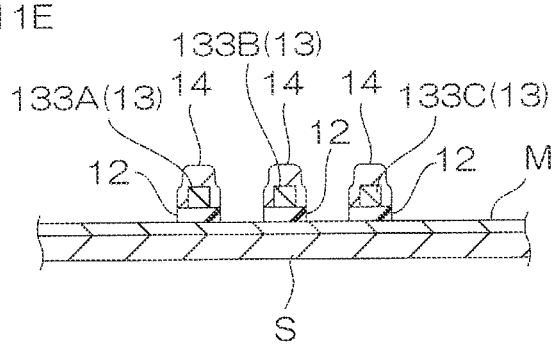
Figure 12A:
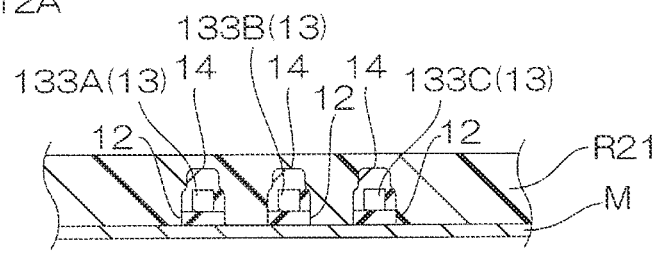
FIGS. 12A to 12D show process views for illustrating the method for producing a wiring circuit board subsequent to FIG. 11E.
Figure 12B:
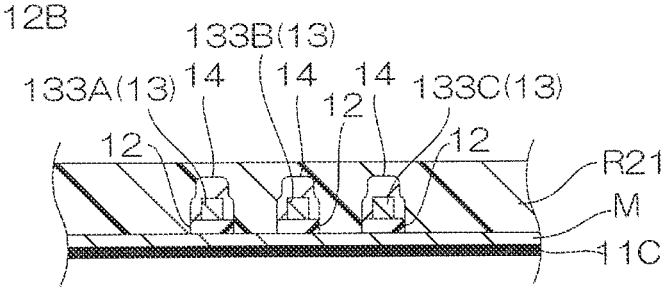
Figure 12C:
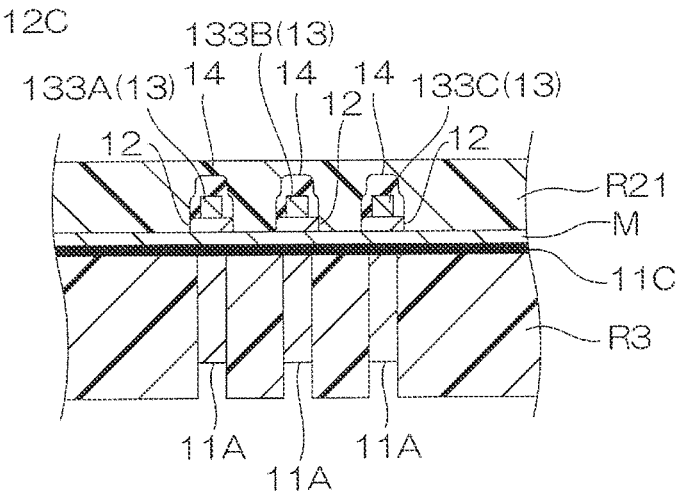
Figure 12D:
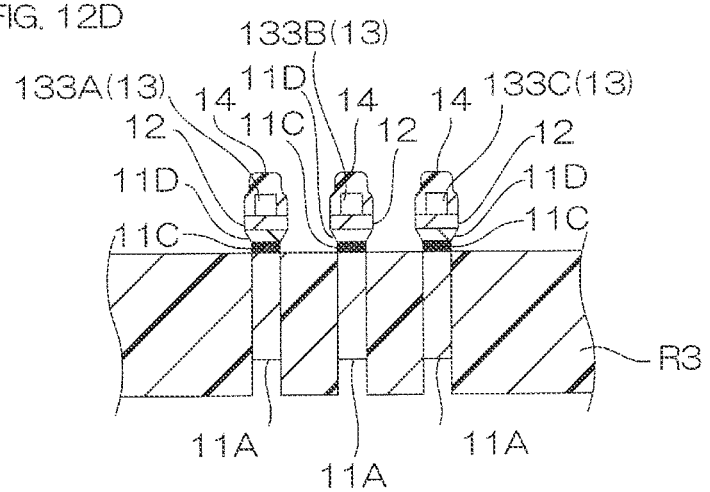

The method for producing the wiring circuit board 1 of the modified example (2) includes a preparation step (ref: FIG. 11A), a metal layer forming step (ref: FIG. 11B), a first patterning step (ref: FIG. 11C), a second patterning step (ref: FIG. 11D), a third patterning step (ref: FIG. 11E), a removing step (ref: FIG. 12A), a bonding layer forming step (ref: FIG. 12B), a deposition step (ref: FIG. 12C), and an etching step (ref: FIG. 12D). The bonding layer forming step is, if necessary, carried out.

As shown in FIG. 11A, in the preparation step, the substrate S is prepared in the same manner as in the preparation step of the above-described embodiment.

Next, as shown in FIG. 11B, in the metal layer forming step, a metal layer M is formed on one side of the substrate S in the thickness direction. The metal layer M is made of the metal which is different from the substrate S. Examples of the material for the metal layer M include nickel, chromium, cobalt, tungsten, and titanium.

The metal layer M is, for example, formed by the electrolytic plating or the sputtering. When the metal layer M is formed by the electrolytic plating, the plating resist is formed on the other surface of the substrate S in the thickness direction, and the metal layer M is formed on the entire one surface of the substrate S in the thickness direction by the electrolytic plating. After the electrolytic plating is completed, the plating resist is peeled. When the metal layer M is formed by the sputtering, the metal layer M is formed on the entire one surface of the substrate S in the thickness direction by the sputtering using the target made of the above-described material for the metal layer M.

Next, as shown in FIG. 11C, in the first patterning step, the first insulating layer 12 is formed on one surface of the metal layer M in the thickness direction in the same manner as in the first patterning step of the above-described embodiment.

Next, as shown in FIG. 11D, in the second patterning step, the conductive pattern 13 is formed on one side of the first insulating layer 12 in the thickness direction in the same manner as in the second patterning step of the above-described embodiment.

Next, as shown in FIG. 11E, in the third patterning step, the second insulating layer 14 is formed on the first insulating layer 12 and the conductive pattern 13 in the same manner as in the third patterning step of the above-described embodiment.

Next, as shown in FIG. 12A, in the removing step, after the second patterning step, the substrate S is removed to expose at least a portion of the metal layer M.

Figure 13:
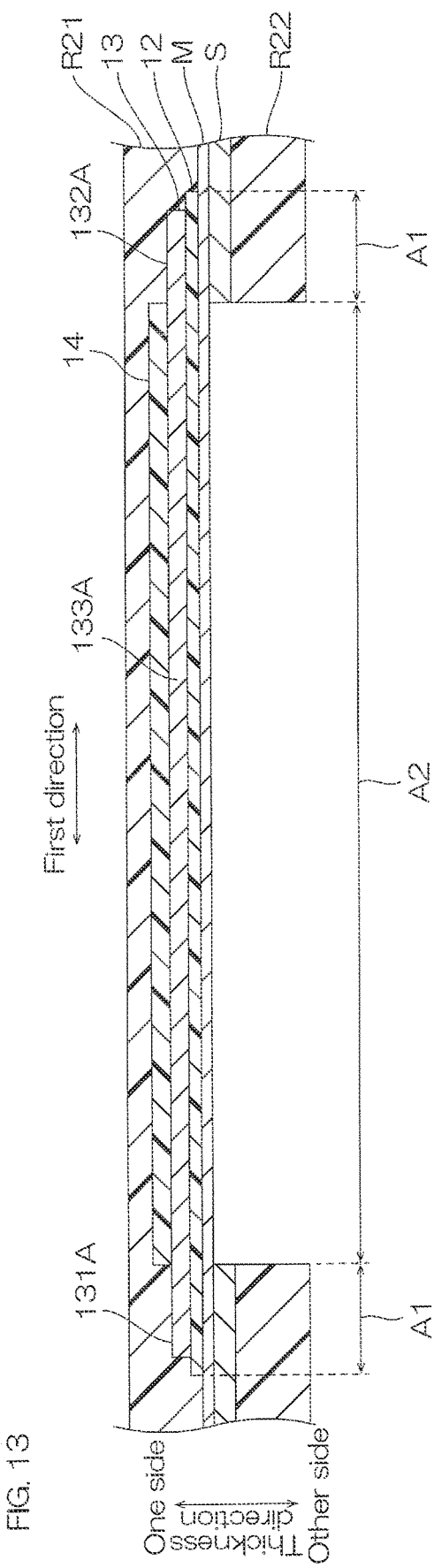
FIG. 13 shows an explanatory view for illustrating arrangement of an etching resist in the removing step shown in FIG. 12A.

To remove the substrate S, as shown in FIG. 13, first, a plating resist R21 is formed on one surface of the metal layer M in the thickness direction so as to cover the entire circuit pattern, and an etching resist R22 is formed on the other surface of the substrate S in the thickness direction so as to cover the first region A1 and to expose the second region A2. Next, the second region A2 of the substrate S is wet-etched from the other side of the substrate S in the thickness direction. Thus, the second region A2 of the substrate S is removed.

In the wet etching, an etching solution which dissolves the substrate S, and does not dissolve the metal layer M is used. For example, when the substrate S is made of a copper alloy and the metal layer M is made of nickel or chromium, as the etching solution, a ferric chloride solution is used.

Next, as shown in FIG. 12B, in the bonding layer forming step, the bonding layer 11C is formed on the other surface of the metal layer M in the thickness direction before the deposition step in the same manner as in the bonding layer forming step of the above-described embodiment.

Next, as shown in FIG. 12C, in the deposition step, the first metal support layer 11A is formed on the bonding layer 11C in the same manner as in the deposition step of the above-described embodiment.

Next, as shown in FIG. 12D, in the etching step, the metal layer M is etched to form the third metal support layer 11D after the deposition step in the same manner as in the etching step of the above-described embodiment.

Thus, the wiring circuit board of the modified example (2) is obtained.

Figure 14A:
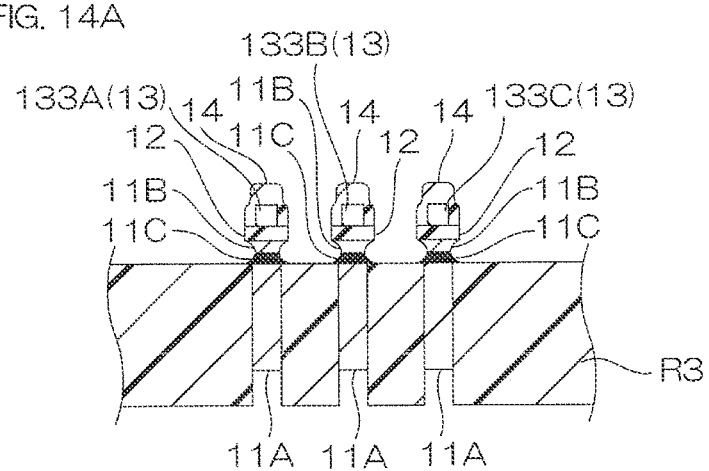
FIG. 14A shows an explanatory view for illustrating an etching step in a method for producing a wiring circuit board of a modified example (3).

(3) The shape of the second metal support layer 11B after the etching step is not limited. The second metal support layer 11B after the etching step may also have, for example, as shown in FIG. 5D, a tapered shape in which the width thereof becomes narrower toward the first metal support layer 11A in the thickness direction, or may also have, as shown in FIG. 14A, a constricted shape in which the width of the central part of the second metal support layer 11B in the thickness direction becomes narrower than the width of one end portion and the other end portion of the second metal support layer 11B in the thickness direction.

Figure 14B:
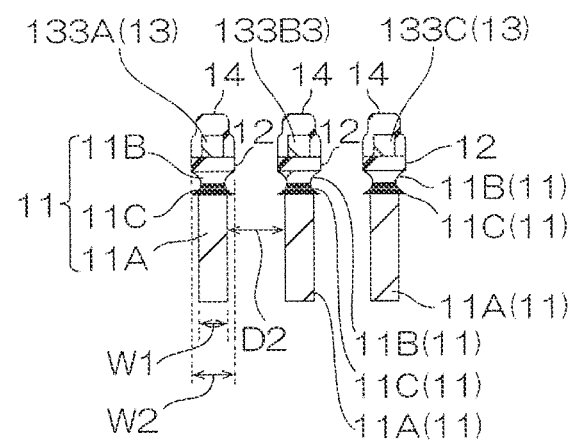
FIG. 14B shows a cross-sectional view of a wiring circuit board obtained by the method for producing a wiring circuit board of the modified example (3), and the cross-sectional view corresponds to the B-B line shown in FIG. 1.

When the second metal support layer 11B after the etching step has the constricted shape, as shown in FIG. 14B, the width of the other end portion of the second metal support layer 11B in the thickness direction may be also wider than the width W1 of the first metal support layer 11A. Further, when the wiring circuit board 1 has the bonding layer 11C, the width of the bonding layer 11C may be also wider than the width W1 of the first metal support layer 11A.

(4) In the bonding layer forming step, it is not necessary to form the bonding layer 11C on the entire other surface of the substrate S (ref: FIG. 5B) or the metal layer M (ref: FIG. 12B) in the thickness direction. The bonding layer 11C may be also pattern-formed in a portion where the first metal support layer 11A is formed in the deposition step.

Figure 15A:
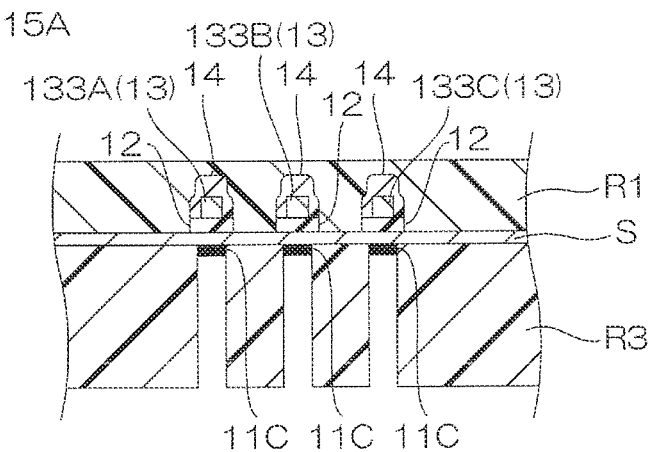
FIG. 15A shows an explanatory view for illustrating a bonding layer forming step in a method for producing a wiring circuit board of a modified example (4).

Specifically, as shown in FIG. 15A, in the bonding layer forming step, the above-described plating resist R3 is formed on the other surface of the substrate S (or the metal layer M) in the thickness direction without peeling the plating resist R1.

Next, the bonding layer 11C is formed on the other surface of the substrate S (or the metal layer M) exposed from the plating resist R3.

Figure 15B:
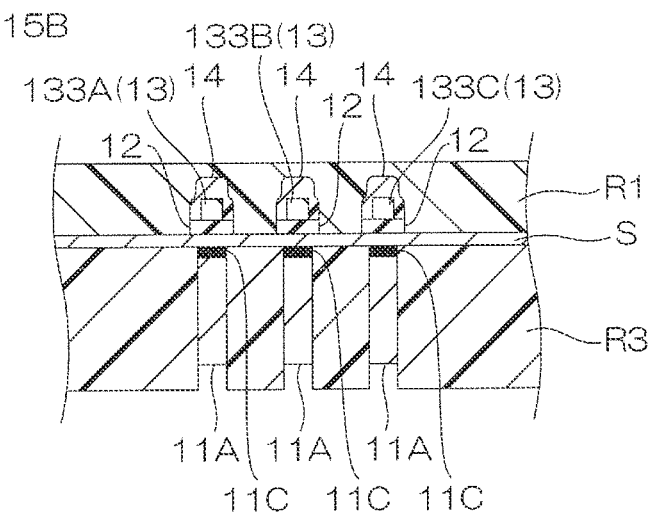
FIG. 15B shows an explanatory view for illustrating a deposition step in the method for producing a wiring circuit board of the modified example (4).

Next, as shown in FIG. 15B, the metal is deposited on the bonding layer 11C without peeling the plating resists R1 and R3 to form the first metal support layer 11A on the bonding layer 11C.

(5) In the modified examples (1) to (4), the same function and effect as that of the above-described embodiment can be obtained.

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICATION

The wiring circuit board of the present invention is, for example, used in connection of electronic components.

DESCRIPTION OF REFERENCE NUMERALS

1 Wiring circuit board
11 Metal support layer
12 First insulating layer (one example of insulating layer)
13 Conductive pattern
111A Terminal support portion
112A Wiring support portion (one example of first wiring support portion)
112B Wiring support portion (one example of second wiring support portion)
11A First metal support layer
11B Second metal support layer
11D Third metal support layer
131A Terminal (one example of first terminal)
131B Terminal (one example of second terminal)
133A Wiring (one example of first wiring)
133B Wiring (one example of second wiring)
S Substrate

The invention claimed is:

1. A wiring circuit board comprising:
an insulating layer;
a conductive pattern disposed on one side of the insulating layer in a thickness direction and having a first terminal, a second terminal, a third terminal, a fourth terminal, a first wiring connecting the first terminal to the third terminal, and a second wiring connecting the second terminal to the fourth terminal and disposed spaced from the first wiring; and
a metal support layer disposed on the other side of the insulating layer in the thickness direction and having a first terminal support portion supporting the first terminal and the second terminal, a second terminal support portion supporting the third terminal and the fourth terminal, a first wiring support portion supporting the first wiring, and a second wiring support portion supporting the second wiring and disposed spaced from the first wiring support portion, wherein
a thickness of each of the first wiring support portion and the second wiring support portion is thinner than the thickness of the first terminal support portion, and also thinner than the thickness of the second terminal support portion.

2. The wiring circuit board according to claim 1, wherein the metal support layer has
a first metal support layer and
a second metal support layer disposed between the first metal support layer and the insulating layer in the thickness direction, and
a thickness of the second metal support layer of each of the first wiring support portion and the second wiring support portion is thinner than the thickness of the second metal support layer of the terminal support portion.

3. The wiring circuit board according to claim 1, wherein the terminal support portion has
a first metal support layer and
a second metal support layer disposed between the first metal support layer and the insulating layer in the thickness direction, and
each of the first wiring support portion and the second wiring support portion has the first metal support layer, and does not have the second metal support layer.

4. The wiring circuit board according to claim 1, wherein the terminal support portion has
a first metal support layer,
a second metal support layer disposed between the first metal support layer and the insulating layer in the thickness direction, and
a third metal support layer disposed between the second metal support layer and the insulating layer in the thickness direction, wherein
each of the first wiring support portion and the second wiring support portion has the first metal support layer and the third metal support layer, and does not have the second metal support layer.

5. A wiring circuit board comprising:
an insulating layer;
a conductive pattern disposed on one side of the insulating layer in a thickness direction and having a first terminal, a second terminal, a first wiring connected to the first terminal, and a second wiring connected to the second terminal and disposed spaced from the first wiring; and
a metal support layer disposed on the other side of the insulating layer in the thickness direction and having a terminal support portion supporting the first terminal and the second terminal, a first wiring support portion supporting the first wiring, and a second wiring support portion supporting the second wiring and disposed spaced from the first wiring support portion, wherein a thickness of each of the first wiring support portion and the second wiring support portion is thinner than the thickness of the terminal support portion; and wherein the metal support layer has a first metal support layer and a second metal support layer disposed between the first metal support layer and the insulating layer in the thickness direction, and a thickness of the second metal support layer of each of the first wiring support portion and the second wiring support portion is thinner than the thickness of the second metal support layer of the terminal support portion.

6. A wiring circuit board comprising:

an insulating layer;

a conductive pattern disposed on one side of the insulating layer in a thickness direction and having a first terminal, a second terminal, a first wiring connected to the first terminal, and a second wiring connected to the second terminal and disposed spaced from the first wiring; and a metal support layer disposed on the other side of the insulating layer in the thickness direction and having a terminal support portion supporting the first terminal and the second terminal, a first wiring support portion supporting the first wiring, and a second wiring support portion supporting the second wiring and disposed spaced from the first wiring support portion, wherein a thickness of each of the first wiring support portion and the second wiring support portion is thinner than the thickness of the terminal support portion; and wherein the terminal support portion has a first metal support layer, a second metal support layer disposed between the first metal support layer and the insulating layer in the thickness direction, and a third metal support layer disposed between the second metal support layer and the insulating layer in the thickness direction, wherein each of the first wiring support portion and the second wiring support portion has the first metal support layer and the third metal support layer, and does not have the second metal support layer.

* * * * *